United States Patent
Wei et al.

(10) Patent No.: US 7,916,516 B2
(45) Date of Patent: Mar. 29, 2011

(54) NONVOLATILE MEMORY APPARATUS AND METHOD FOR WRITING DATA IN NONVOLATILE MEMORY APPARATUS

(75) Inventors: Zhiqiang Wei, Osaka (JP); Kazuhiko Shimakawa, Osaka (JP); Takeshi Takagi, Kyoto (JP); Yoshikazu Katoh, Osaka (JP)

(73) Assignee: Panasonic Corporation, Osaka (JP)

( * ) Notice: Subject to any disclaimer, the term of this patent is extended or adjusted under 35 U.S.C. 154(b) by 104 days.

(21) Appl. No.: 12/524,313

(22) PCT Filed: Feb. 22, 2008

(86) PCT No.: PCT/JP2008/000304
§ 371 (c)(1),
(2), (4) Date: Jul. 23, 2009

(87) PCT Pub. No.: WO2008/105155
PCT Pub. Date: Sep. 4, 2008

(65) Prior Publication Data
US 2010/0110766 A1    May 6, 2010

(30) Foreign Application Priority Data

Feb. 23, 2007   (JP) ................ 2007-043734

(51) Int. Cl.
*G11C 11/00*   (2006.01)
(52) U.S. Cl. ..................... 365/148; 365/105
(58) Field of Classification Search .......... 365/148, 365/105, 100, 175
See application file for complete search history.

(56) References Cited

U.S. PATENT DOCUMENTS

| | | | |
|---|---|---|---|
| 2003/0206473 A1* | 11/2003 | Tran | 365/207 |
| 2006/0120205 A1 | 6/2006 | Odagawa et al. | |
| 2006/0227591 A1* | 10/2006 | Lowrey et al. | 365/148 |

FOREIGN PATENT DOCUMENTS

| | | |
|---|---|---|
| JP | 2003-068984 | 3/2003 |
| JP | 2006-135335 | 5/2006 |
| WO | WO 2006/028117 A1 | 3/2006 |
| WO | WO 2006/137111 A1 | 12/2006 |
| WO | WO 2008/012871 A1 | 1/2008 |

* cited by examiner

*Primary Examiner* — Vu A Le
(74) *Attorney, Agent, or Firm* — McDermott Will & Emery LLP

(57) ABSTRACT

A nonvolatile memory apparatus comprises a memory array (102) including plural first electrode wires (WL) formed to extend in parallel with each other within a first plane; plural second electrode wires (BL) formed to extend in parallel with each other within a second plane parallel to the first plane and to three-dimensionally cross the plural first electrode wires; and nonvolatile memory elements (11) which are respectively provided at three-dimensional cross points between the first electrode wires and the second electrode wires, the elements each having a resistance variable layer whose resistance value changes reversibly in response to a current pulse supplied between an associated first electrode wire and an associated second electrode wire; and a first selecting device (13) for selecting the first electrode wires, and further comprises voltage restricting means (15) provided within or outside the memory array, the voltage restricting means being connected to the first electrode wires, for restricting a voltage applied to the first electrode wires to a predetermined upper limit value or less; wherein plural nonvolatile memory elements of the nonvolatile memory elements are connected to one first electrode wire connecting the first selecting device to the voltage restricting means.

13 Claims, 12 Drawing Sheets

| CURRENT DRIVING | | | |
|---|---|---|---|
| WIRE RESISTANCE | 50 | 250 | ΔR |
| INITIAL RESISTANCE | 2626.4 | 2885.7 | 259.4 |
| HIGH-RESISTANCE | 4813.4 | 4715.8 | 97.6 |
| LOW-RESISTANCE | 2685.3 | 2625.7 | 59.5 |

Fig. 4

| VOLTAGE DRIVING | | | |
|---|---|---|---|
| WIRE RESISTANCE | 50 | 250 | ΔR |
| INITIAL RESISTANCE | 2620.0 | 2843.5 | 223.5 |
| HIGH-RESISTANCE | 5257.7 | 4348.6 | 909.1 |
| LOW-RESISTANCE | 2500.6 | 3084.3 | 583.7 |

Fig.6

NONVOLATILE MEMORY APPARATUS AND METHOD FOR WRITING DATA IN NONVOLATILE MEMORY APPARATUS

RELATED APPLICATIONS

This application is the U.S. National Phase under 35 U.S.C. §371 of International Application No. PCT/JP2008/000304, filed on Feb. 22, 2008, which in turn claims the benefit of Japanese Application No. 2007-043734, filed on Feb. 23, 2007, the disclosures of which Applications are incorporated by reference herein.

TECHNICAL FIELD

The present invention relates to a memory apparatus for storing data using a material whose resistance value changes in response to electric pulses applied.

BACKGROUND ART

A resistance variable material has a characteristic in which its resistance value significantly changes according to a magnitude or polarity of an electric pulse applied and the changed resistance value is maintained. In recent years, a resistance variable element using the resistance variable material and a semiconductor apparatus such as a nonvolatile memory apparatus using the resistance variable element have been developed by utilizing such characteristics.

Patent document 1 discloses a configuration of an example of a conventional nonvolatile memory apparatus using the resistance variable element. FIG. 11 is a schematic block diagram showing a configuration of the conventional nonvolatile memory apparatus. As shown in FIG. 11, a nonvolatile memory apparatus 80 comprises a memory circuit 82 and a memory region 70 connected to the memory circuit 82. The memory region 70 includes bit lines B1 to B4 (lower electrodes 74) arranged to extend in parallel with each other, word lines W1 to W4 arranged to cross the bit lines B1 to B4 (upper electrodes 78), resistance variable elements 52 which are arranged at crossing regions between the bit lines and the word lines, and protective resistors 54 connected in parallel with the resistance variable elements 52. Each bit 50 includes the lower electrode 74, the upper electrode 78, the resistance variable element 52 and the protective resistor 54. The memory circuit 82 includes bit pass transistors 84 respectively connected to the bit lines B1 to B4. The bit pass transistors 84 respectively have bit pass gates 64 and are respectively connected to load transistors 86 respectively having load gates 66 and to inverters 90.

In FIG. 11, active layers are illustrated as an array of resistors connected between the lower electrodes 74 (bit lines B1 to B4) and the upper electrodes 78 (word lines W1 to W4).

In the nonvolatile memory apparatus configured as described above, an ON-voltage is applied to the gate of the bit pass transistor 84 and a second ON-voltage is applied to the gate of the load transistor 86, thus applying a voltage pulse to a desired word line. Thereby, data is stored in the resistance variable element 54 connected to the word line.

Patent document 1: Japanese Laid-Open Patent Application Publication No. 2003-68984

DISCLOSURE OF THE INVENTION

Problems to be Solved by the Invention

In the above described conventional nonvolatile memory apparatus, wire resistance is present in the bit lines B1 to B4 and in the word lines W1 to W4, and voltage division occurs between the wire and the resistance variable element due to the wire resistance. The wire length varies from resistance variable element to resistance variable element. Therefore, even if an equal voltage pulse is applied to a word line, the voltages applied to the respective resistance variable elements connected to the word line are different. This causes a variation in high-resistance values and a variation in low-resistance values among the resistance variable elements. This may lead to a situation in which writing and reading of data cannot be performed correctly.

The present invention has been developed under the circumstances, and an object of the present invention is to provide a nonvolatile memory apparatus which is capable of suppressing a variation in resistance values of resistance variable elements.

Another object of the present invention is to provide a so-called cross-point nonvolatile memory apparatus which is operable in response to current pulses.

Means for Solving the Problem

To solve the above described problem, a nonvolatile memory apparatus of the present invention comprises a memory array including plural first electrode wires formed to extend in parallel with each other within a first plane; plural second electrode wires formed to extend in parallel with each other within a second plane parallel to the first plane and to three-dimensionally cross the plural first electrode wires; and nonvolatile memory elements respectively provided at three-dimensional cross positions between the plural first electrode wires and the plural second electrode wires; and a first selecting device connected to the plural first electrode wires, for selecting the first electrode wires, wherein each of the nonvolatile memory elements has a resistance variable layer whose resistance value changes reversibly in response to a current pulse supplied between a first electrode wire and a second electrode wire which are provided to correspond to a three-dimensional cross position of the each nonvolatile memory element, the nonvolatile memory apparatus further comprising voltage restricting means provided within or outside the memory array, the voltage restricting means being connected to the first electrode wires, for restricting a voltage applied to the first electrode wires to a predetermined upper limit value or less; wherein plural nonvolatile memory elements of the nonvolatile memory elements are connected to one first electrode wire connecting the first selecting device to the voltage restricting means.

In such a configuration, it is possible to provide a cross-point nonvolatile memory apparatus which is current-drivable. By providing the voltage restricting means, it is possible to suppress a variation in the resistance values of the resistance variable layers included in the respective nonvolatile memory elements even when wire resistance is present in the first electrode wires and in the second electrode wires included in the memory array.

The nonvolatile memory apparatus according to the above invention may further comprise a current pulse application device which is connected to the first selecting device, for applying a current pulse having a current value to the nonvolatile memory element via the first selecting device.

By incorporating the current pulse application device, it is possible to provide a cross-point nonvolatile memory apparatus which is current-drivable.

In the nonvolatile memory apparatus according to the above invention, as the voltage restricting means, voltage clamp circuits may be provided to respectively correspond to the first electrode wires.

In the nonvolatile memory apparatus according to the above invention, as the voltage restricting means, diodes may be provided to respectively correspond to the first electrode wires.

In the nonvolatile memory apparatus according to the above invention, as the voltage restricting means, transistors may be provided to respectively correspond to the first electrode wires.

In the nonvolatile memory apparatus according to the above invention, the voltage restricting means may be provided to correspond to each of the first electrode wires; and the voltage restricting means may be configured to restrict upper limit values of voltages such that the upper limit values are different between the first electrode wires to which the voltage restricting means is connected.

In such a configuration, it is possible to suppress a variation in the resistance values of the elements due to the difference in the first electrode wires to which the elements are connected.

A method for writing data to a nonvolatile memory apparatus of the present invention including plural nonvolatile memory elements each having a first electrode, a second electrode, and a resistance variable layer which is disposed between the first electrode and the second electrode, a resistance value of the resistance variable layer reversibly changing in response to an electric pulse supplied between the first electrode and the second electrode, comprises applying the electric pulse to the nonvolatile memory element using a constant current source to change the resistance value of the nonvolatile memory element.

In such a configuration, since the data is written using the electric pulse having a constant current value, the voltage applied to the both ends of the element is proportional to the resistance value of the element and is not affected by the wire resistance. Since the voltage applied to the both ends of the element is stabilized, a variation in the resistance values written in the elements is significantly suppressed.

The above and further objects, features and advantages of the present invention will more fully be apparent from the following detailed description of preferred embodiments with accompanying drawings.

Effect of the Invention

In accordance with the present invention, it is possible to provide a nonvolatile memory apparatus which is capable of suppressing a variation in the resistance values of the resistance variable elements.

BRIEF DESCRIPTION OF THE DRAWINGS

FIG. 4 is a table showing resistance values of elements which are different due to the wire resistance in a case where the current driving is performed.

FIG. 6 is a table showing resistance values of elements which are different due to wire resistance in a case where the voltage driving is performed.

FIG. 9($b$) is a graph showing a result of an operation of the nonvolatile memory apparatus according to Embodiment 2 of the present invention.

Figure 1:
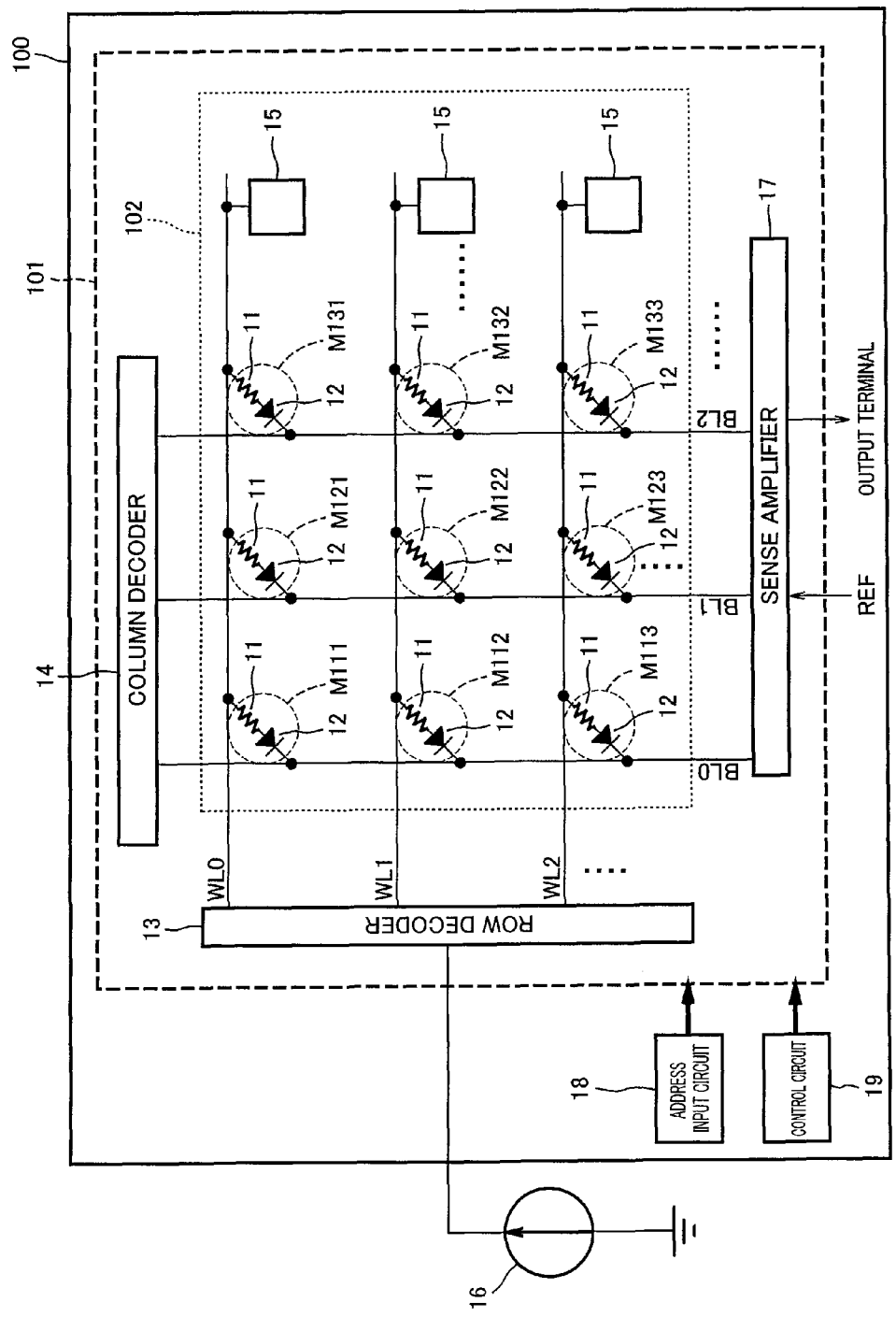
FIG. 1 is a block diagram showing a configuration of a nonvolatile memory apparatus according to Embodiment 1 of the present invention.

| EXPLANATION OF REFERENCE NUMERALS | |
|---|---|
| 11 | resistance variable layer |
| 12 | diode |
| 13 | row decoder |
| 14 | column decoder |
| 15 | voltage clamp circuit |
| 16 | current source |
| 17 | sense amplifier |
| 18 | address input circuit |
| 19 | control circuit |
| 21 | diode |
| 41 | transistor |
| 50 | comparator |
| 51 | transistor |
| 100, 200, 300, 400 | nonvolatile memory apparatus |
| 101, 201, 301, 401 | memory base section |
| 102, 202, 302, 402 | memory array |
| 111 | lower electrode |
| 112 | upper electrode |
| BL0, BL1, . . . | bit line |
| M111, M112, . . . | memory cell |
| WL0, WL1, . . . | word line |

BEST MODE FOR CARRYING OUT THE INVENTION

Hereinafter, preferred embodiments of the present invention will be described with reference to the drawings. The same constituents are designated by the same reference numerals throughout the drawings and repetitive description thereof will be sometimes omitted.

Embodiment 1

Configuration of Nonvolatile Memory Apparatus

FIG. 1 is a block diagram showing a configuration of a nonvolatile memory apparatus according to Embodiment 1 of the present invention.

As shown in FIG. 1, a nonvolatile memory apparatus 100 according to this embodiment comprises a memory base section 101 on a semiconductor substrate. The memory base section 101 includes a memory array 102, a row decoder 13 (first selecting device), a column decoder 14 (second selecting device), and a sense amplifier 17 for detecting an amount of a current flowing in a selected bit line and determining whether stored data is "1" or "0." The nonvolatile memory apparatus 100 further comprises an address input circuit 18 for receiving an address signal externally input, and a control circuit 19 configured to control the operation of the memory base section 101 based on a control signal externally input.

The memory array 102 includes on the semiconductor substrate, plural word lines WL0, WL1, WL2, . . . (first electrode wires) formed to extend in parallel with each other within a first plane parallel to a main surface of the semiconductor substrate and plural bit lines BL0, BL1, BL2, . . . (second electrode wires) which are provided above the plural word lines WL0, WL1, WL2, . . . such that the bit lines BL0, BL1, BL2, . . . are arranged to extend in parallel with each other within a plane (second plane) parallel to the main surface of the semiconductor substrate and three-dimensionally cross the plural word lines WL0, WL1, WL2, . . . .

In addition, plural memory cells M111, M112, M113, M121, M122, M123, M131, M132, M133, . . . (hereinafter expressed as "memory cells M111, M112, . . . ") are arranged in matrix so as to respectively correspond to three-dimensional cross points (three-dimensional cross positions) between the plural word lines WL0, WL1, WL2, . . . and the plural bit lines BL0, BL1, BL2, . . . .

Figure 2:
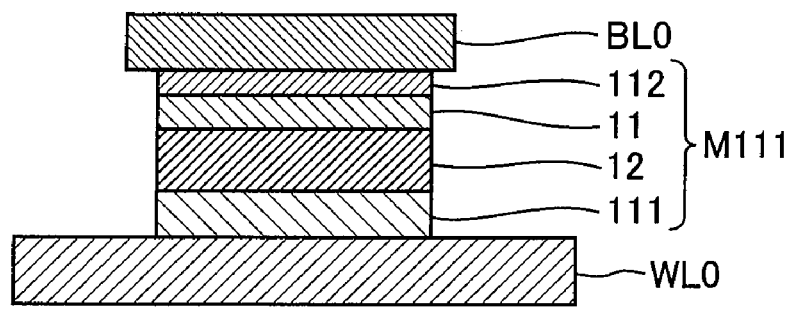
FIG. 2 is a cross-sectional view showing a configuration of a memory cell (FeOx) included in the nonvolatile memory apparatus according to Embodiment 1 of the present invention.

FIG. 2 is a cross-sectional view showing a configuration of the memory cell M111 included in the nonvolatile memory apparatus according to Embodiment 1 of the present invention. Memory cells other than the memory cell M111 have the same configuration.

As shown in FIG. 2, the memory cell M111 intervenes between the word line WL0 and the bit line BL0, and includes the lower electrode 111 (first electrode), a diode 12, the resistance variable layer 11, and an upper electrode 112 (second electrode) which are laminated in this order. The lower electrode 111, the diode 12, the resistance variable layer 11, and the upper electrode 112 constitute a nonvolatile memory element (resistance variable element). The resistance variable layer 11 has characteristics in which its resistance value changes reversibly in response to an electric pulse (in this embodiment current pulse) which is supplied between the upper electrode 112 and the lower electrode 111. It should be noted that the constituents forming the nonvolatile memory element are not particularly limited. The nonvolatile memory element may consist of the resistance variable layer 11. The electrodes may be omitted. That is, the word line may serve as the lower electrode and the bit line may serve as the upper electrode.

For the resistance variable layer 11, a material expressed as a chemical formula $FeO_x$ ($1.3 < x < 1.6$) may be used. In addition to this, an oxide material showing resistance switching as in $FeO_x$ may be used.

When lithography is used in a pattering process, the thickness of the resistance variable layer 11 is preferably 200 nm or less because the resistance variable layer 11 which is thinner is easier to process in a semiconductor manufacture process. To avoid the breakdown which would occur when a current is applied to the resistance variable layer 11, the thickness of the resistance variable layer 11 is preferably at least 10 nm or larger. Therefore, the thickness of the resistance variable layer 11 is preferably about 10 nm to 200 nm.

The lower electrode 111 and the upper electrode 112 are made of, for example, Pt, Ir, or the like. Preferably, the thickness of these electrodes is about 100 nm to 200 nm because of the above mentioned reason for the semiconductor manufacture process and to avoid migration associated with the applied current.

As shown in FIG. 2, the diode 12 is connected in series with the resistance variable layer 11 between the lower electrode 111 and the upper electrode 112. The diode 12 is desirably formed by a metal-insulator-metal (so-called MIM). This can increase current drivability. In this embodiment, the diode 12 is a bidirectional diode (e.g., varistor) which decreases its resistance value when an absolute value of a voltage applied to both ends thereof exceeds a predetermined threshold. This enables writing using a positive pulse and a negative pulse. In unipolar (nonpolar) drive, a unidirectional diode may be used.

The memory array 102 includes voltage clamp circuits 15 (voltage restricting means) each of which serves to clamp a voltage (voltage between the lower electrode 111 and the upper electrode 112) of each of the memory cells M111, M112, . . . which is generated by supplying a current pulse (electric pulse having a constant current value which is output from a constant current source) to each of the memory cells M111, M112, . . . so that the voltage of each of the memory cells M111, M112, . . . does not exceed a reference voltage. The voltage clamp circuits 15 are respectively connected to associated ones of the word lines WL0, WL1, WL2, . . . such that the voltage clamp circuit 15 and the row decoder 13 sandwich therein plural memory cells connected to the associated word line (plural nonvolatile memory elements are connected to one word line connecting the voltage clamp circuit 15 to the row decoder 13). Each voltage clamp circuit 15 compares the voltage of the associated one of the memory cells M111, M112, . . . to a preset reference voltage and is activated when the voltage of the associated one of the memory cells M111, M112, . . . reaches the preset reference voltage. As a result, the current pulse is supplied to each of the memory cells M111, M112, . . . in a restricted manner.

The word lines WL0, WL1, WL2, . . . are connected to a current source 16 (constant current source for outputting an electric pulse having a constant current value: current pulse application device) via the row decoder 13. The bit lines BL0, BL1, BL2, . . . are connected to the sense amplifier 17 via a switch which are not shown. An output terminal is connected to the sense amplifier 17 and a reference level input REF is input to the sense amplifier 17.

The address input circuit 18 receives an address signal from an external circuit which is not shown and outputs a row address signal to the row decoder 13 based on the address signal, and outputs a column address signal to a column decoder 14 based on the address signal. As used herein, the address signal is a signal indicating an address of a specified memory cell selected from among the plural memory cells M111, M112, . . . . The row address signal is a signal indicating a row address of the addresses indicated by the address signal, while the column address signal is a signal indicating a column address of the addresses indicated by the address signal.

In a write operation, the control circuit 19 outputs to the row decoder 13 a write signal for causing application of a write current according to the input data received from an external circuit which is not shown. On the other hand, in a read operation, the control circuit 19 outputs to the row decoder 13 a read signal for causing application of a read current.

The row decoder 13 receives the row address signal output from the address input circuit 18, selects one of the plural word lines WL0, WL1, WL2, . . . according to the row address signal, and applies a write current and a read current to the selected word line.

The column decoder 14 receives the column address signal output from the address input circuit 18 and selects one of the plural bit lines BL0, BL1, BL2, . . . according to the column address signal.

[Operation of Nonvolatile Memory Apparatus]

Subsequently, the operation of the nonvolatile memory apparatus 100 of this embodiment configured as described above will be described.

[Write Operation]

Initially, the operation of the nonvolatile memory apparatus 100 in a case where data is written to the memory cell will be described. By way of example, a case where data is written to the memory cell M111 provided at an intersection (cross point) between the word line WL0 and the bit line BL0 will be described.

The row decoder 13 is connected to each of the word lines. The row decoder 13 selects the word line WL0 based on the row address signal output from the address input circuit 18. The column decoder 14 is connected to each of the bit lines. The column decoder 14 selects the bit line BL0 based on the column address signal output from the address input circuit 18. Thereby, the current source 16 is connected to the word line WL0 and the bit line BL0 is electrically grounded. Also, a switch connecting the bit line BL to the sense amplifier 17 is turned OFF. As a result, the write current pulse is supplied between the word line WL0 and the bit line BL0.

In this embodiment, the current values of the write current pulses applied to the word line WL0 are set to +2 mA and −2 mA. In this embodiment, it is supposed that a reference voltage (upper limit voltage in voltage compliance) of the voltage clamp circuit 15 is set to 1.4V.

When the current pulse of +2 mA is applied to the word line WL0, the current pulse is supplied to the memory cell M111, causing the resistance variable layer 11 included in the memory cell M111 to turn to a high-resistance state. In principle, no current flows in memory cells except for the selected memory cell, and therefore, a voltage at a connection point between the voltage clamp circuit 15 and the word line WL0 is equal to a voltage at a connection point between the memory cell M111 and the word line WL0 (no current flows between the memory cell M111 and the clamp circuit 15, and no electric potential drop occurs). The voltage clamp circuit 15 rapidly decreases its resistance value and conducts a current, thus restricting the supply of the current pulse to memory cell M111 when the voltage (voltage at the connection point between the memory cell M111 and the word line WL0) of the memory cell M111 in the case where the current pulse of +2 mA is applied to the word line WL0 reaches 1.4V. As a result, an increase in the voltage of the memory cell M111 is restricted, and the resistance value (resistance value in the vicinity of measurement current 10 μA) of the resistance variable layer 11 included in the memory cell M111 is about 10 kΩ. If a constant current is applied to the element to turn the element to a high-resistance state without setting a voltage compliance, an electric potential difference between the both ends of the element increases undesirably rapidly with an increase in the resistance value, possibly causing breakdown of the element. In this embodiment, the voltage compliance is set when the element is turned to the high-resistance state so that breakdown of the element is prevented.

On the other hand, when the current pulse of −2 mA is applied to the word line WL0, the current pulse is supplied to the memory cell M111, causing the resistance variable layer 11 included in the memory cell M111 to turn to a low-resistance state. In this case, the voltage clamp circuit 15 is not activated. As a result, the resistance value (resistance value in the vicinity of measurement current 10 μA) of the resistance variable layer 11 included in the memory cell M111 is about 1 kΩ. When the element is turned to the low-resistance state, the electric potential difference between the both ends of the element decreases with a decrease in the resistance value, so that the resistance value naturally stops changing. Therefore, the voltage compliance is not always necessary when the element is turned to the low-resistance state.

By causing the resistance value of the resistance variable layer 11 turned to the high-resistance state and the resistance value of the resistance variable layer 11 turned to the low-resistance state to respectively correspond to two values of binary data, binary data can be written to the memory cell M111.

[Read Operation]

The operation of the nonvolatile memory apparatus 100 which occurs when the data is read from the memory cell M111 to which the binary data has been written as described above will be described.

The row decoder 13 selects the word line WL0 based on the row address signal output from the address input circuit 18. The column decoder 14 selects the bit line BL0 based on the column address signal output from the address input circuit 18. Thereby, the current source 16 is connected to the word line WL0 and the bit line BL0 is electrically grounded. In addition, the switch connecting the bit line BL0 to the sense amplifier 17 is turned ON. As a result, a read current pulse is supplied between the word line WL0 and the bit line BL0, and the sense amplifier 17 detects the electric potential of the bit line BL0. In this embodiment, the current value of the read current pulse applied to the word line WL0 is set to 10 μA.

As described above, the high-resistance value of the resistance variable layer 11 is about ten times larger than the low-resistance value of the resistance variable layer 11. For this reason, the electric potential of the bit line BL0 in the case where the read current pulse is applied to the word line WL0 is significantly different between the resistance variable layer 11 turned to the high-resistance state and the resistance variable layer 11 turned to the low-resistance state. The sense amplifier 17 calculates the difference between the input electric potential of the reference level input REF and the electric potential of the bit line BL0. This makes it possible to detect the resistance value of the resistance variable layer 11. The sense amplifier 17 outputs data "0" or "1" to the output terminal according to the resistance value of the resistance variable layer 11. Thus, the data written in the memory cell M111 can be read.

In the manner described above, data is written and read. In the nonvolatile memory apparatus 100 of this embodiment, by providing the voltage clamp circuits 15 for restricting the voltages of the memory cells M111, M112, . . . to the reference voltages, it is possible to suppress a variation in the resistance values of the resistance variable layers 11 of the memory cells M111, M112, . . . even when wire resistance is present in the word lines WL0, WL1, WL2, . . . and the bit lines BL0, BL1, BL2, . . . .

The reference voltages of the voltage clamp circuits 15 may be set to an equal value or to different values. The wire resistances corresponding to the elements connected to a common bit line may be different due to difference in word lines to which the elements are connected (position in the column direction in the memory array). By setting different reference voltages of the voltage clamp circuits 15 from word line to word line, it is possible to further suppress a variation in the resistance values of the elements depending on the position on the memory array. In this case, it is not necessary to make the reference voltages of the voltage clamp circuits 15 different depending on the voltage clamp circuit 15. For example, an equal reference voltage may be used for a set of the plural word lines. The reference voltages of the voltage compliance may be made different according to the word lines in other Embodiments.

The voltage restricting means need not be provided for each word line. For example, a common voltage restricting means may be provided for plural word lines. In this case, for example, the voltage restricting means may select only the word line selected by the row decoder and restricts the voltage applied to the selected word line in accordance with the control of the control circuit 19. The voltage restricting means may be provided within or outside the memory array.

Example

Two circuits each including one element connected to a wire having a wire resistance controlled at 50Ω and two circuits each including one element connected to a wire having a wire resistance controlled at 250Ω were created. The elements were created under the same condition (material of resistance variable layer: FeOx, material of electrode: Pt, area of resistance variable layer: 0.25 μm$^2$, area of electrode: 0.25 μm$^2$, thickness of resistance variable layer: 100 nm, thickness of electrode: 100 nm). The voltage-current characteristic and the resistance value were measured in the case where the current driving (pulse application using the constant current source) is performed in a circuit having a wire resistance of 50Ω and in a circuit having a wire resistance of 250Ω and in the case where the voltage driving (pulse application using the constant voltage source) is performed in the circuit having a wire resistance of 50Ω and in the circuit having a wire resistance of 250Ω.

In the current driving, the constant current source was used, and the voltage was measured while changing the current value by 0.01 mA at 33 ms time intervals in the order of 0 mA→2 mA→0 mA→−2 mA. The voltage compliance (upper limit value of the voltage) was set to +1.5V.

In the voltage driving, the constant voltage source was used, and the current was measured while changing the voltage value by 0.01V at 33 ms time intervals in the order of 0V→+1.4V→0V→−1.4V. The current compliance (upper limit value of current) was set to −2 mA.

Figure 3:
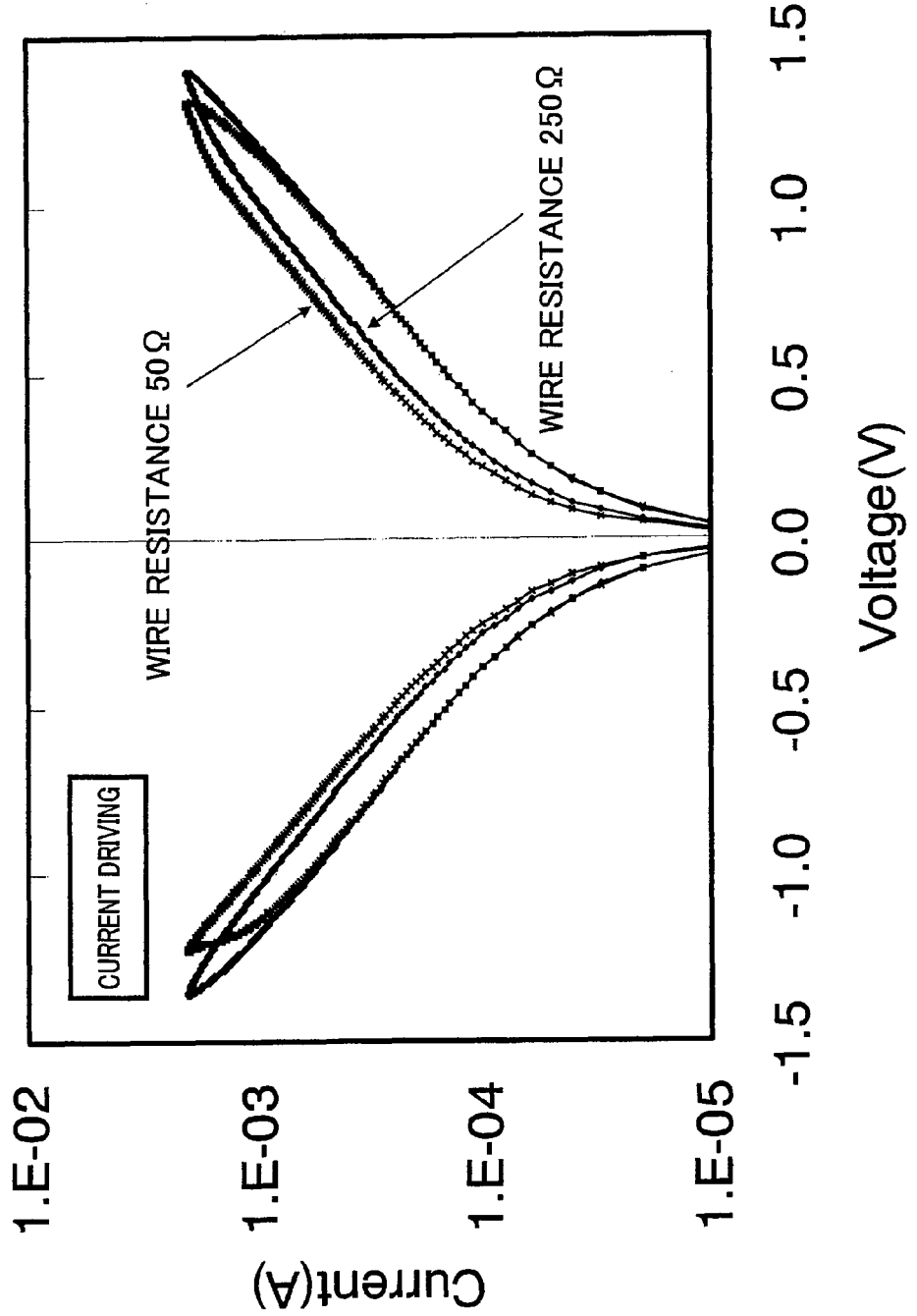
FIG. 3 is a graph showing voltage-current characteristics which are different due to wire resistances in a case where current driving is performed.
Figure 5:
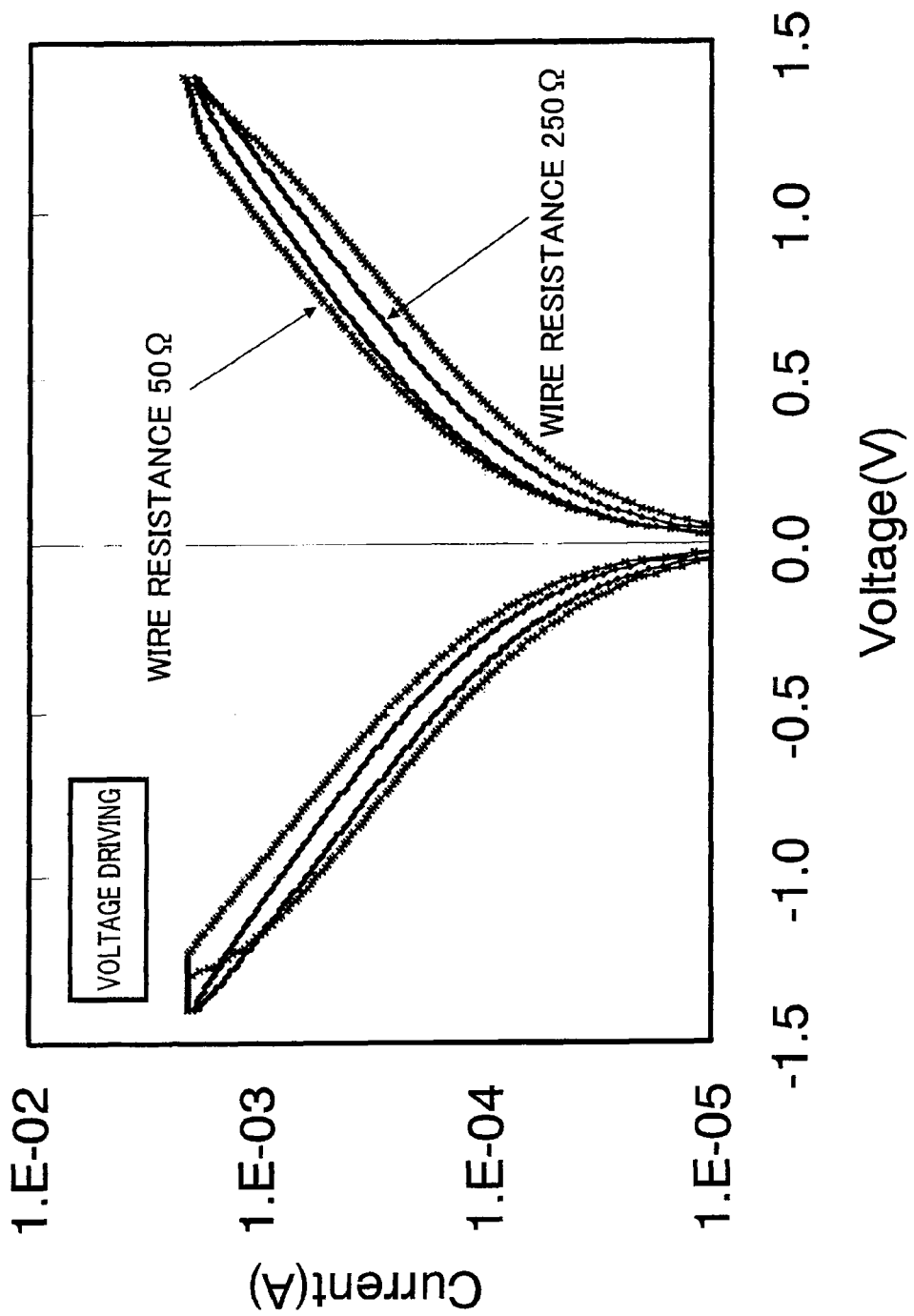
FIG. 5 is a graph showing voltage-current characteristics which are different due to the wire resistances in a case where voltage driving is performed.

FIG. 3 is a graph showing voltage-current characteristics which are different due to the wire resistances in a case where current driving is performed. FIG. 4 is a table showing resistance values of elements which are different due to the wire resistance in a case where current driving is performed. FIG. 5 is a graph showing voltage-current characteristics which are different due to the wire resistances in a case where voltage driving is performed. FIG. 6 is a table showing resistance values of elements which are different due to the wire resistance in a case where voltage driving is performed. The numeric values illustrated at the right ends of FIGS. 4 and 6 are differences of the resistance values due to the wire resistances. FIGS. 4 and 6 also show the resistance values corresponding to initial states for the purpose of reference.

As can be clearly seen from the measurement results shown in FIGS. 3 to 6, a variation in the resistance values due to the wire resistances was smaller in the current driving than in the voltage driving. To be specific, with regard to the resistance values of the element in the high-resistance state, the difference in the resistance values which is caused by the difference in the wire resistance is 909.1 Ω in the case of voltage driving, while the difference in the resistance values which is caused by the difference in the wire resistance is 97.6Ω in the case of current driving. With regard to the resistance values of the elements in the low-resistance state, the difference in the resistance values which is caused by the difference in the wire resistance is 583.7Ω in the case of voltage driving, while the difference in the resistance values which is caused by the difference in the wire resistance is 59.5Ω in the case of current driving. That is, the influence of the difference in the wire resistances on the resistance values written in the elements is significantly less in the case of the current driving than in the voltage driving.

The difference between the current driving and the voltage driving may be brought about by a mechanism described below. The nonvolatile memory elements have characteristics in which the resistance values written in the elements significantly vary due to a slight difference in the voltage applied to both ends of the elements. In order to suppress the variation in the resistance values written in the elements, it is necessary to apply to the both ends of the elements a voltage which is as constant as possible. Since a pulse is applied with a predetermined voltage and a voltage division relationship occurs between the wire resistance and the element in the voltage driving, the voltage applied to the both ends of the element changes according to the wire resistance. In contrast, since a pulse is applied to the element with a predetermined current in the current driving, the voltage applied to the both ends of the element is proportional to the resistance value of the element itself, and is not affected by the wire resistance. That is, in the current driving, the voltage applied to the both ends of the elements is made uniform, and a variation in the resistance values written in the elements is significantly reduced.

In a case where a cross-point nonvolatile memory including memory elements formed in an array form is operated, the wire resistance is different depending on the position on the array. By using the current driving as a method for writing data to the nonvolatile memory element, it is possible to suppress a variation in the resistance values of the elements depending on the position on the array.

In the current driving, an electric potential difference between the both ends of the element increases undesirably rapidly with an increase in the resistance value when writing to the high-resistance state is performed, possibly causing breakdown of the element. By using a combination of the current driving and the voltage compliance, it is possible to suppress a variation in the resistance values while preventing breakdown of the element.

[Modification]

Figure 7:
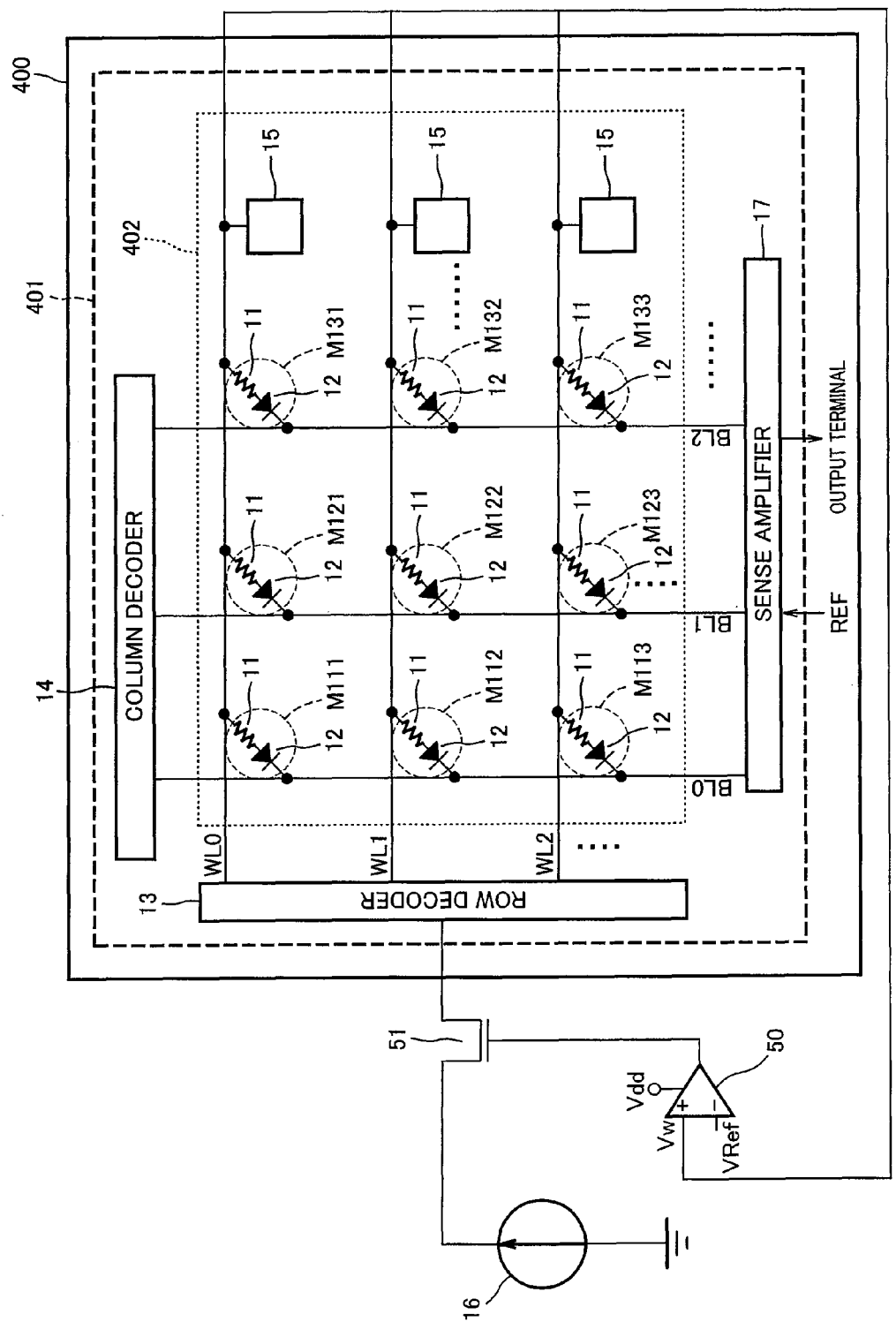
FIG. 7 is a block diagram showing a configuration of a modification of the nonvolatile memory apparatus according to Embodiment 1 of the present invention.

FIG. 7 is a block diagram showing a configuration of a modification of the nonvolatile memory apparatus according to Embodiment 1 of the present invention. The nonvolatile memory apparatus of this modification is different from the nonvolatile memory apparatus of FIG. 1 in that the nonvolatile memory apparatus of this modification does not include the current source.

As shown in FIG. 7, a nonvolatile memory apparatus 400 of this modification comprises on the semiconductor substrate a memory base section 401. The memory base section 401 includes a memory array 402. The voltage clamp circuits 15 on the memory array 402 are connected to a comparator 50 provided outside. The comparator 50 is connected to a switch transistor 51 for controlling connection between a current source 16 provided outside the nonvolatile memory apparatus 400 and the row decoder 13. The comparator 50 compares an output voltage Vw output from each of the clamp circuits 15 to a reference voltage Vref input from outside and controls ON-OFF of the transistor 51 according to a result. In this embodiment, in a case where the row decoder 13 and the column decoder 14 select the word line and the bit line, respectively, to supply a current pulse to a specified memory cell, the value of the reference voltage Vref is controlled so that the transistor 51 is ON before the value of the output voltage Vw from the clamp circuit reaches 1.4V and the transistor 51 is OFF when the value of the output voltage Vw has reached 1.4V. The reference voltage Vref is controlled by an electric power supply voltage Vdd.

With the above described configuration, it is possible to suppress a variation in the resistance values of the resistance variable layers 11 in the memory cells M111, M112, . . . .

Embodiment 2

A nonvolatile memory apparatus according to Embodiment 2 comprises plural diodes as voltage restricting means for restricting the voltages of the memory cells to predetermined voltages, as described below.

[Configuration of Nonvolatile Memory Apparatus]

Figure 8:
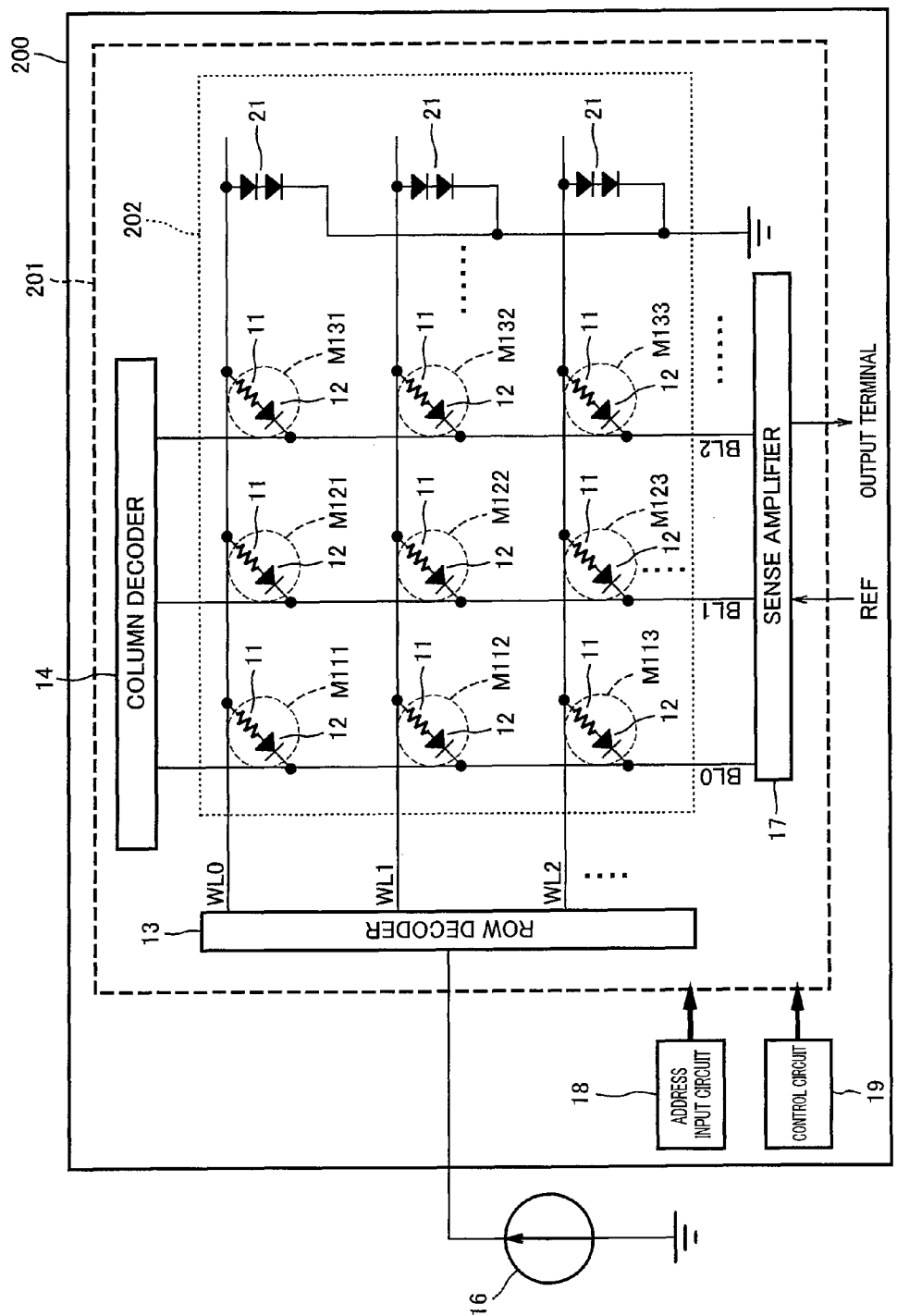
FIG. 8 is a block diagram showing a configuration of the nonvolatile memory apparatus according to Embodiment 2 of the present invention.

FIG. 8 is a block diagram showing a configuration of a nonvolatile memory apparatus according to Embodiment 2 of the present invention.

As shown in FIG. 8, a nonvolatile memory apparatus 200 according to this embodiment comprises a memory base section 201 on the semiconductor substrate. The memory base section 201 includes a memory array 202. The memory array 202 includes plural diodes 21 connected in series between the word lines WL0, WL1, WL2, . . . and a ground. The sum of threshold voltages of the plural diodes 21 is set equal to the reference voltage of each of the voltage clamp circuits 15 included in the nonvolatile memory apparatus of Embodiment 1. In other words, the number of the diodes 21 is determined so that the sum of threshold voltages of the plural diodes 21 is set equal to the reference voltage of each of the voltage clamp circuits 15 included in the nonvolatile memory apparatus of Embodiment 1. By way of example, a reference voltage of a general silicon diode is 0.7V. For example, when the reference voltage is 1.4V, two diodes 21 are provided. These diodes 21 may be formed in the same step that the diodes 11 included in the memory cells M111, M112, . . . are formed.

The other constituents of the nonvolatile memory apparatus of Embodiment 2 are identical to those of Embodiment 1. Therefore, they are identified by the same reference numbers and will not be described repetitively.

[Operation of Nonvolatile Memory Apparatus]

Subsequently, the operation of the nonvolatile memory apparatus 200 of this embodiment which is configured as described above will be described.

[Write Operation]

Initially, the operation of the nonvolatile memory apparatus 200 in a case where data is written to the memory cell will be described. By way of example, a case where data is written to the memory cell M111 provided at a cross point between the word line WL0 and the bit line BL0 will be described.

As in the operation of Embodiment 1, the row decoder 13 selects the word line WL0 based on the row address signal output from the address input circuit 18, while the column decoder 14 selects the bit line BL0 based on the column address signal output from the address input circuit 18. Thereby, the current source 16 is connected to the word line WL0 and the bit line BL0 is electrically grounded. In addition, the switch connecting the bit line BL0 to the sense amplifier 17 is turned OFF. As a result, a write current pulse is supplied between the word line WL0 and the bit line BL0.

In this embodiment, as in Embodiment 1, the current values of the write current pulses applied to the word line WL0 are set to +2 mA and −2 mA.

When the current pulse of +2 mA is applied to the word line WL0, the current pulse is supplied to the memory cell M111, causing the resistance variable layer 11 included in the memory cell M111 to turn to a high-resistance state. The plural diodes 21 are turned ON when the voltage of the memory cell M111 in the case where the current pulse of +2 mA is applied to the word line WL0 reaches a sum of the threshold voltages. Thereby, the current pulse is supplied to the memory cell M111 in a restricted manner. As a result, an increase in the voltage of the memory cell M111 is restricted, and the resistance value of the resistance variable layer 11 included in the memory cell M111 is about 10 kΩ.

On the other hand, when the current of −2 mA is applied to the word line WL0, the current pulse is supplied to the memory cell M111, causing the resistance variable layer 11 included in the memory cell M111 to turn to a low-resistance state. In this case, the plural diodes 21 are turned OFF. As a result, the resistance value of the resistance variable layer 11 included in the memory cell M111 is about 1 kΩ.

By causing the resistance value of the resistance variable layer 11 turned to the high-resistance state and the resistance value of the resistance variable layer 11 turned to the low-resistance state to respectively correspond to two values of binary data, binary data can be written to the memory cell M111.

[Read Operation]

The operation of the nonvolatile memory apparatus 200 which occurs when the data is read from the memory cell M111 to which the binary data has been written as described above is identical to that of Embodiment 1, and therefore will not be described repetitively.

Table 1 shows the states of the word line, the bit line, the resistance variable layer, and the diode as the voltage restricting means in the above described write operation and read operation.

TABLE 1

| Operation content | Word line | Bit line | Resistance variable layer | Diode |
|---|---|---|---|---|
| Write(+2 mA) | +2 mA is applied | Grounded | High-resistance → High-resistance | ON |
| | | | Low-resistance → High-resistance | OFF → ON |
| Write(−2 mA) | −2 mA is applied | Grounded | High-resistance → Low-resistance | OFF |
| | | | Low-resistance → Low-resistance | OFF |
| Read | 1 mA is applied | Connected to sense amplifier | High-resistance → High-resistance | OFF |
| | | | Low-resistance → Low-resistance | OFF |

As can be seen from table 1, when data is written with +2 mA and the resistance variable layer is in the high-resistance state, the diode is ON. As a result, the resistance variable layer maintains the high-resistance state. On the other hand, when the resistance variable layer is in the low-resistance state, the diode is changed from OFF to ON. As a result, the resistance variable layer is switched to the high-resistance state.

Since the diode as the voltage restricting means operates as described above, it is possible to suppress a variation in the resistance values of the resistance variable layers 11 of the memory cells M111, M112, . . . even when the wire resistance is present in the word lines WL0, WL1, WL2, . . . and the bit lines BL0, BL1, BL2, . . . .

Figure 9A:
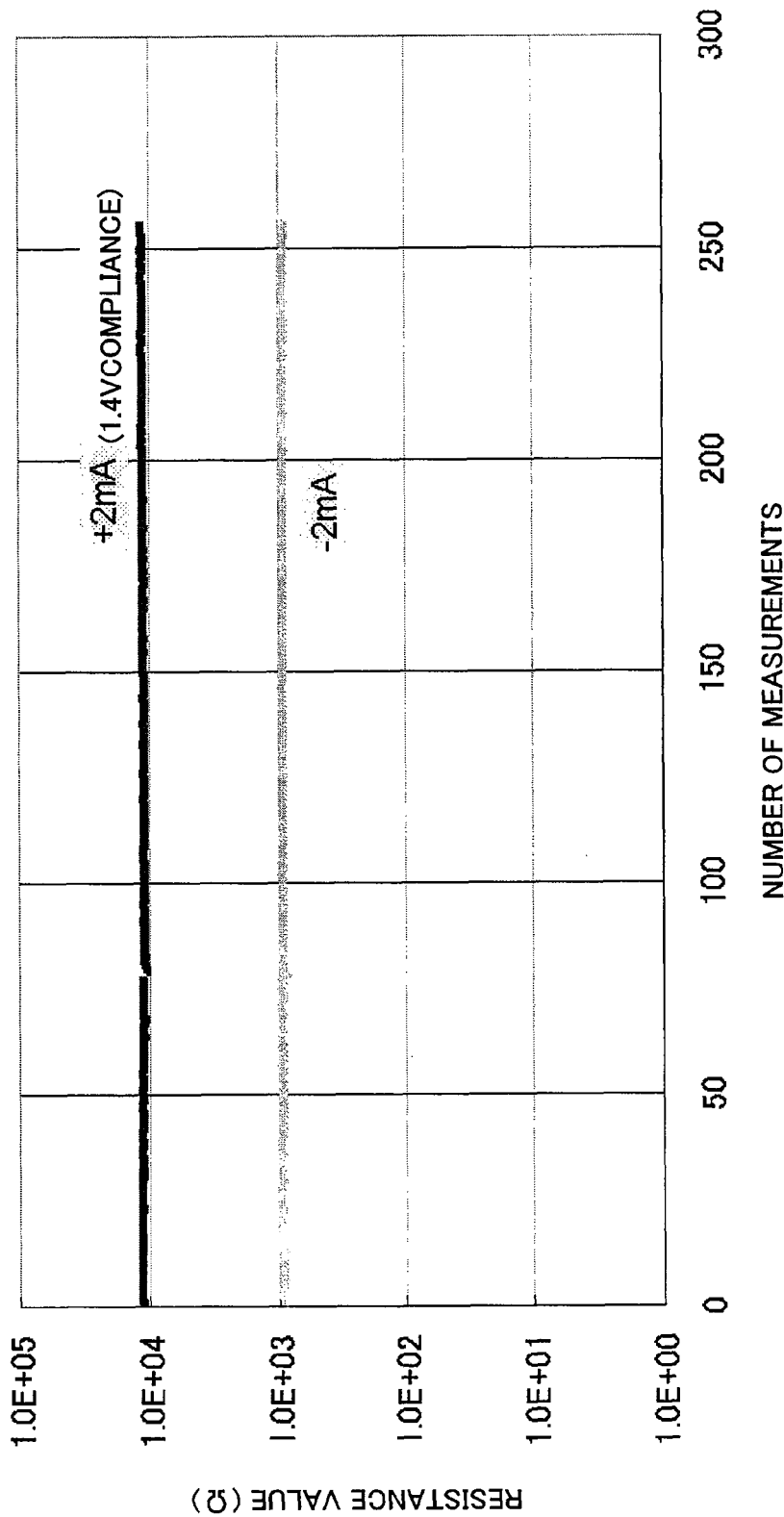
FIG. 9($a$) is a graph showing a result of an operation of the nonvolatile memory apparatus according to Embodiment 2 of the present invention.
Figure 9B:
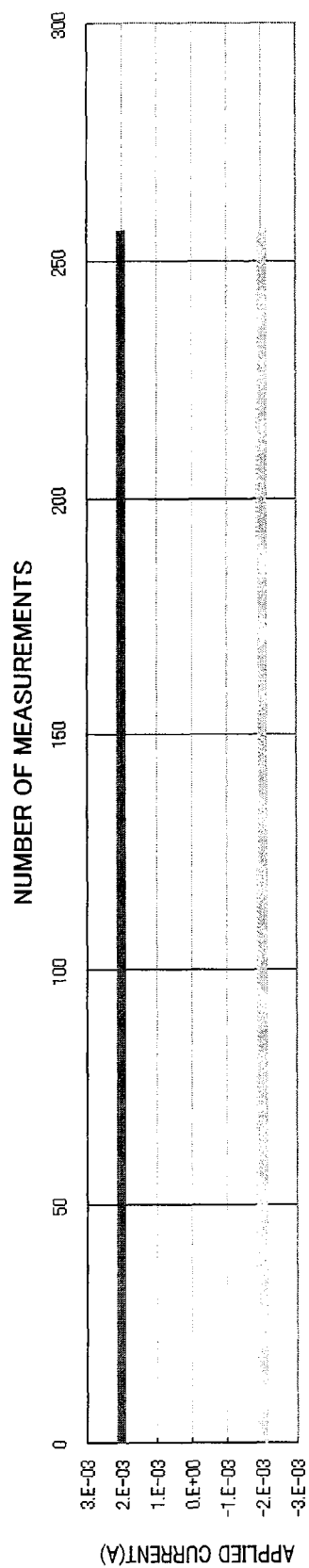

FIGS. 9(a) and 9(b) are graphs showing results of the operation of the nonvolatile memory apparatus according to Embodiment 2 of the present invention. In FIG. 9(a), a vertical axis indicates the resistance value of the resistance variable layer which is obtained after positive and negative currents are applied and a horizontal axis indicates the number of measurements. In FIG. 9(b), a vertical axis indicates the current value of positive and negative currents which are applied to the word line and a horizontal axis indicates the number of measurements.

As shown in FIG. 9(b), the positive and negative current pulses were applied to the word line 250 times. As a result, as shown in FIG. 9(a), the resistance value of the resistance variable layer stably had 10 kΩ or 1 kΩ, and it was confirmed that there is no variation in the resistance values.

Embodiment 3

A nonvolatile memory apparatus according to Embodiment 3 comprises transistors as voltage restricting means for restricting the voltages of the memory cells to predetermined voltages as described below.

[Configuration of Nonvolatile Memory Apparatus]

Figure 10:
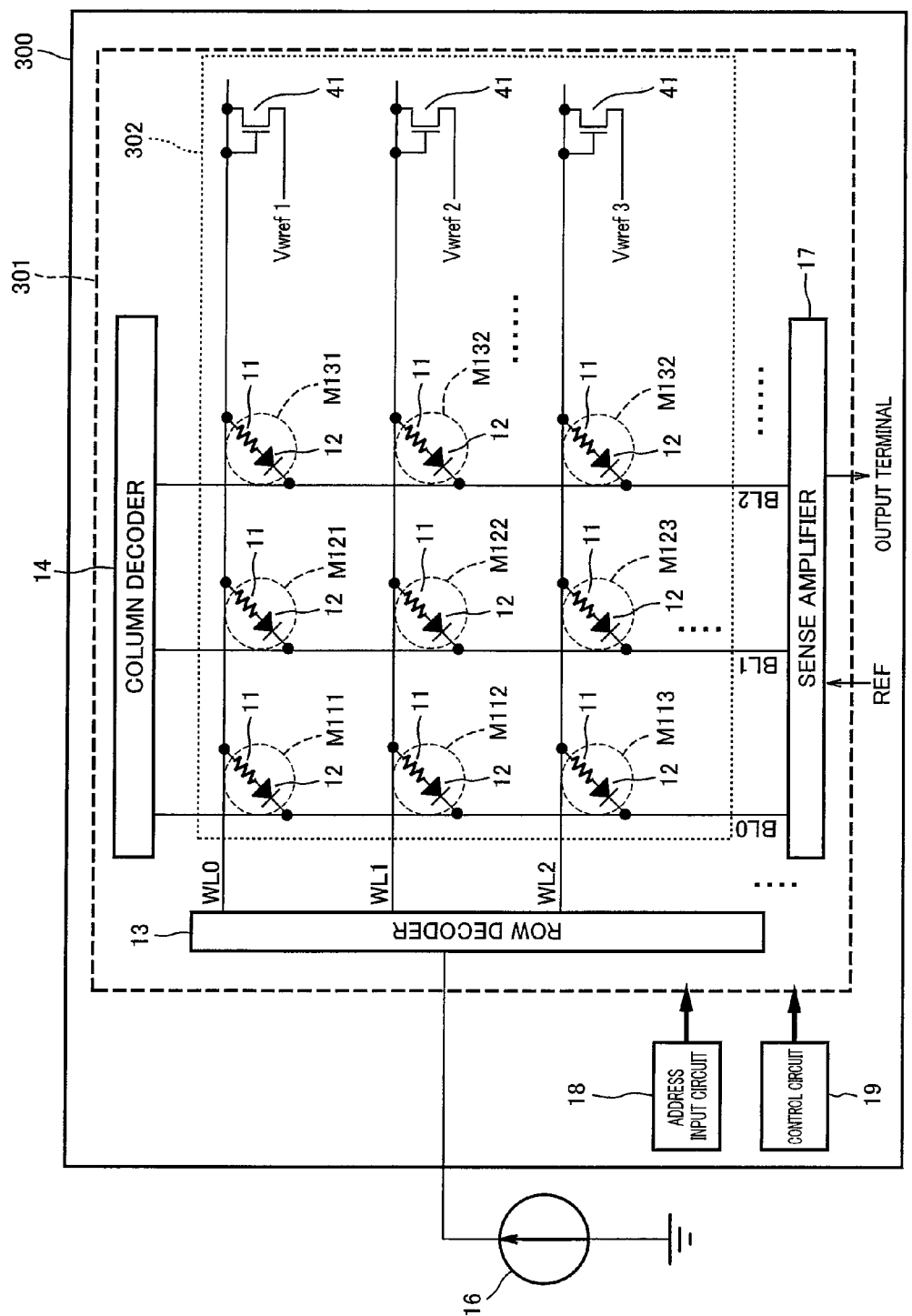
FIG. 10 is a block diagram showing a configuration of a nonvolatile memory apparatus according to Embodiment 3 of the present invention.
Figure 11:
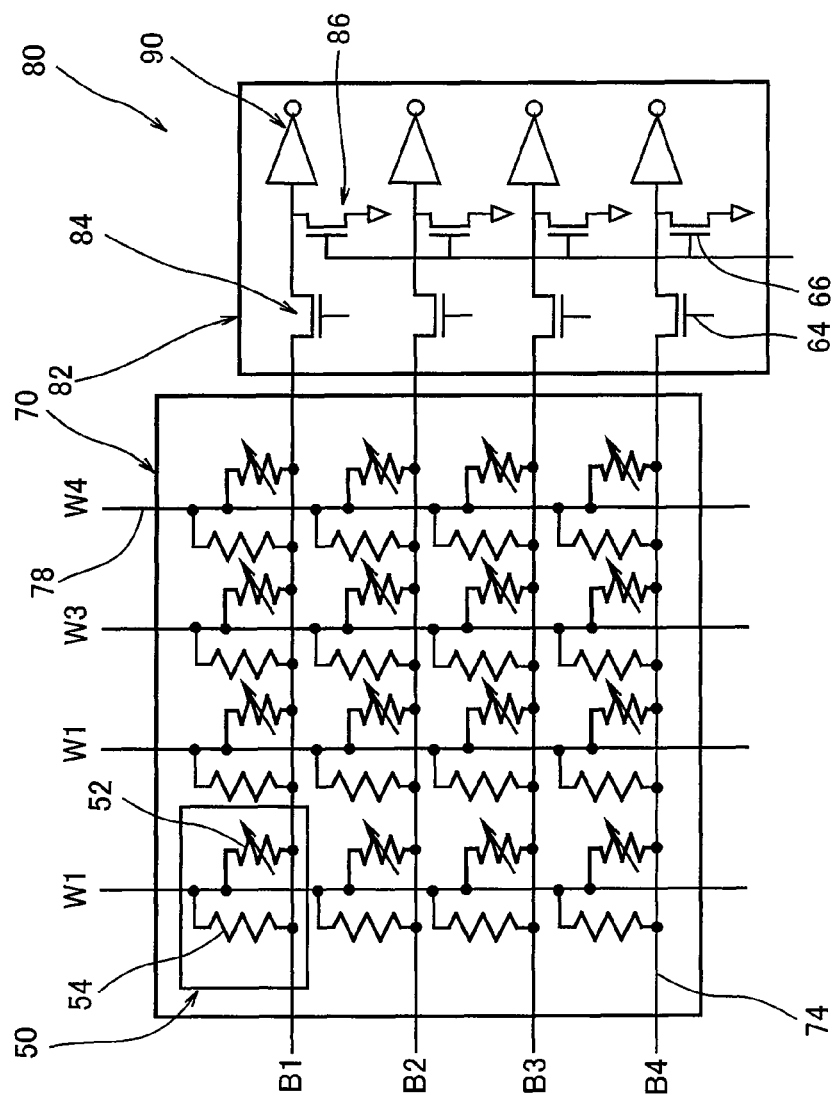
FIG. 11 is a schematic block diagram of the conventional nonvolatile memory apparatus.

FIG. 10 is a block diagram showing a configuration of a nonvolatile memory apparatus according to Embodiment 3 of the present invention.

As shown in FIG. 10, a nonvolatile memory apparatus 300 according to this embodiment comprises a memory base section 301 on the semiconductor substrate. The memory base section 301 includes a memory array 302. In the memory array 302, the gates and sources of the transistors 41 are connected to the word lines WL0, WL1, WL2, . . . between the row decoder 13 and the memory cells M111, M121, M131, . . . on first column. The drains of the transistors 41 are respectively connected to the electric power supplies (not shown) of the reference voltages Vwref1, Vwref2, Vwref3, . . . .

The transistors 41 serve to execute control so that the current is supplied or not supplied to the resistance variable layers 11 of the memory cells M111, M112, . . . .

The other constituents of the nonvolatile memory apparatus of Embodiment 3 are identical to those of Embodiment 1. Therefore, they are identified by the same reference numbers and will not be described repetitively.

[Operation of Nonvolatile Memory Apparatus]

Subsequently, the operation of the nonvolatile memory apparatus 300 of this embodiment which is configured as described above will be described.

[Write Operation]

Initially, the operation of the nonvolatile memory apparatus 300 in a case where data is written to the memory cell will be described. By way of example, a case where data is written to the memory cell M111 provided at a cross point between the word line WL0 and the bit line BL0 will be described.

As in Embodiment 1, the row decoder 13 selects the word line WL0 based on the row address signal output from the address input circuit 18, while the column decoder 14 selects the bit line BL0 based on the column address signal output from the address input circuit 18. Thereby, the current source 16 is connected to the word line WL0 and the bit line BL0 is electrically grounded. In addition, the switch connecting the bit line BL0 to the sense amplifier 17 is turned OFF. As a result, a write current pulse is supplied between the word line WL0 and the bit line BL0.

In this embodiment, as in Embodiment 1, the current values of the write current pulses applied to the word line WL0 are set to +2 mA and −2 mA. In this embodiment, it is supposed that a reference voltage Vwref1 applied to the drain of the transistor 41 is set to 1.4V.

When the current of +2 mA is applied to the word line WL0, the current pulse is supplied to the memory cell M111, causing the resistance variable layer 11 included in the memory cell M111 to turn to a high-resistance state. The plural diodes 21 are turned ON when the voltage of the memory cell M111 in the case where the current pulse of +2 mA is applied to the word line WL0 exceeds 1.4V. Thereby, the current pulse is supplied to the memory cell M111 in a restricted manner. As a result, an increase in the voltage of the memory cell M111 is restricted, and the resistance value of the resistance variable layer 11 included in the memory cell M111 is about 10 kΩ.

On the other hand, when the current pulse of −2 mA is applied to the word line WL0, the current pulse is supplied to the memory cell M111, causing the resistance variable layer 11 included in the memory cell M111 to turn to a low-resistance state. In this case, the transistor 41 is turned OFF. As a result, the resistance value of the resistance variable layer 11 included in the memory cell M111 is about 1 kΩ.

By causing the resistance value of the resistance variable layer 11 turned to the high-resistance state and the resistance value of the resistance variable layer 11 turned to the low-resistance state to respectively correspond to two values of binary data, binary data can be written to the memory cell M111.

[Read Operation]

The operation of the nonvolatile memory apparatus 300 which occurs when the data is read from the memory cell M111 to which the binary data has been written as described above is similar to that of Embodiment 1 and will not be described repetitively.

Since the transistors as the voltage restricting means operate as described above, it is possible to suppress a variation in the resistance values of the resistance variable layers 11 of the memory cells M111, M112, . . . even when the wire resistance is present in the word lines WL0, WL1, WL2, . . . and the bit lines BL0, BL1, BL2, . . . . In addition, in the case where the transistor is used as in this embodiment, there is an advantage that the voltage of the memory cell can be restricted easily by controlling the reference voltage.

In the nonvolatile memory apparatuses of the above described embodiments, +2 mA and −2 mA are used as the current values of the write current pulse in the case where data is written, and 10 µA is used as the current value of the read current pulse in the case where data is read, the current values are not limited to these. The nonvolatile memory apparatus of the present invention is capable of operating without a variation in the resistance values of the resistance variable layers when a current density is within a range of $2 \times 10^3$ to $1 \times 10^6$ A/cm$^2$.

Industrial Applicability

A nonvolatile memory apparatus of the present invention is capable of suppressing a variation in resistance values of resistance variable elements and is useful as a nonvolatile memory element or the like for use with various electronic hardware such as personal computers or cellular phones.

The invention claimed is:

1. A nonvolatile memory apparatus comprising:
a memory array including plural first electrode wires formed to extend in parallel with each other within a first plane; plural second electrode wires formed to extend in parallel with each other within a second plane parallel to the first plane and to three-dimensionally cross the plural first electrode wires; and nonvolatile memory elements respectively provided at three-dimensional cross positions between the plural first electrode wires and the plural second electrode wires;

a first selecting device connected to the plural first electrode wires, for selecting the first electrode wires; and a current pulse application device which is connected to the first selecting device, for applying a current pulse having a predetermined current value to the nonvolatile memory element via the first selecting device;

wherein each of the nonvolatile memory elements has a resistance variable layer whose resistance value changes reversibly in response to a current pulse supplied from the current pulse application device between a first electrode wire and a second electrode wire which are provided to correspond to a three-dimensional cross position of the each nonvolatile memory element, the nonvolatile memory apparatus further comprising:

voltage clamp circuits provided within or outside the memory array so as to respectively correspond to the first electrode wires, the voltage clamp circuits being connected to the first electrode wires, for restricting a voltage applied to the first electrode wires to a predetermined upper limit value or less; wherein plural nonvolatile memory elements of the nonvolatile memory elements are connected to one first electrode wire connecting the first selecting device to an associated one of the voltage clamp circuits.

2. The nonvolatile memory apparatus according to claim 1, wherein as the voltage clamp circuits, diodes are provided to respectively correspond to the first electrode wires.

3. The nonvolatile memory apparatus according to claim 1, wherein as the voltage clamp circuits, transistors are provided to respectively correspond to the first electrode wires.

4. A method for writing data to a nonvolatile memory apparatus, including a memory array including plural first electrode wires formed to extend in parallel with each other within a first plane; plural second electrode wires formed to extend in parallel with each other within a second plane parallel to the first plane and to three-dimensionally cross the plural first electrode wires; and nonvolatile memory elements respectively provided at three-dimensional cross positions between the plural first electrode wires and the plural second electrode wires;

wherein each of the nonvolatile memory elements has a resistance variable layer whose resistance value changes reversibly in response to a current pulse supplied between a first electrode wire and a second electrode wire which are provided to correspond to a three-dimensional cross position of the each nonvolatile memory element; and voltage clamp circuits provided within or outside the memory array so as to respectively correspond to the first electrode wires, the voltage clamp circuits being connected to the first electrode wires, for restricting a voltage applied to the first electrode wires to a predetermined upper limit value or less;

said method comprising:

to switch the resistance variable layer from a high-resistance state to a low-resistance state, applying a current pulse to an associated one of the first electrode wires using a constant current source, to change a resistance value of the resistance variable layer; and to switch the resistance variable layer from the low-resistance state to the high-resistance state, applying the current pulse to the associated one of the first electrode wires using the constant current source and restricting a voltage applied to the associated first electrode wire to a predetermined upper limit value or less using a voltage clamp circuit connected to the associated first electrode wire, to change the resistance value of the resistance variable layer.

5. The nonvolatile memory apparatus according to claim 3, wherein a gate and source of each of the transistors are connected to an associated one of the first electrode wires, and a reference voltage which is the predetermined upper limit value is given to a drain of the each transistor.

6. The nonvolatile memory apparatus according to claim 1, wherein the voltage clamp circuits are provided to respectively correspond to the first electrode wires, and the voltage clamp circuits are configured to restrict the upper limit value of the voltage such that upper limit values corresponding to the first electrode wires to which the voltage clamp circuits are respectively connected are different between the first electrode wires.

7. The nonvolatile memory apparatus according to claim 2, wherein the voltage clamp circuits are provided to respectively correspond to the first electrode wires, and the voltage clamp circuits are configured to restrict the upper limit value of the voltage such that upper limit values corresponding to the first electrode wires to which the voltage clamp circuits are respectively connected are different between the first electrode wires.

8. The nonvolatile memory apparatus according to claim 3, wherein the voltage clamp circuits are provided to respectively correspond to the first electrode wires, and the voltage clamp circuits are configured to restrict the upper limit value of the voltage such that upper limit values corresponding to the first electrode wires to which the voltage clamp circuits are respectively connected are different between the first electrode wires.

9. The nonvolatile memory apparatus according to claim 5, wherein the voltage clamp circuits are provided to respectively correspond to the first electrode wires, and the voltage clamp circuits are configured to restrict the upper limit value of the voltage such that upper limit values corresponding to the first electrode wires to which the voltage clamp circuits are respectively connected are different between the first electrode wires.

10. The nonvolatile memory apparatus according to claim 6, wherein as the upper limit value of the voltage of the voltage clamp circuits, an equal upper limit value is used for a set of ones of the plural first electrodes wires.

11. The nonvolatile memory apparatus according to claim 7, wherein as the upper limit value of the voltage of the voltage clamp circuits, an equal upper limit value is used for a set of ones of the plural first electrodes wires.

12. The nonvolatile memory apparatus according to claim 8, wherein as the upper limit value of the voltage of the voltage clamp circuits, an equal upper limit value is used for a set of ones of the plural first electrodes wires.

13. The nonvolatile memory apparatus according to claim 9, wherein as the upper limit value of the voltage of the voltage clamp circuits, an equal upper limit value is used for a set of ones of the plural first electrodes wires.

* * * * *